United States Patent
Wang et al.

(10) Patent No.: US 8,088,499 B1
(45) Date of Patent: Jan. 3, 2012

(54) OPTOELECTRONIC DEVICE WITH NANOPARTICLE EMBEDDED HOLE INJECTION/TRANSPORT LAYER

(75) Inventors: Qingwu Wang, Chelmsford, MA (US); Wenguang Li, Andover, MA (US); Hua Jiang, Methuen, MA (US)

(73) Assignee: Agiltron, Inc., Woburn, MA (US)

( * ) Notice: Subject to any disclaimer, the term of this patent is extended or adjusted under 35 U.S.C. 154(b) by 847 days.

(21) Appl. No.: 11/589,338

(22) Filed: Oct. 30, 2006

Related U.S. Application Data

(60) Provisional application No. 60/730,822, filed on Oct. 28, 2005.

(51) Int. Cl.
*H01L 51/50* (2006.01)

(52) U.S. Cl. ......... 428/690; 428/917; 257/40; 313/504; 313/505; 313/506

(58) Field of Classification Search ............... 428/690, 428/917; 313/504, 505, 506; 257/40
See application file for complete search history.

(56) References Cited

U.S. PATENT DOCUMENTS

| | | | |
|---|---|---|---|
| 6,486,601 B1 * | 11/2002 | Sakai et al. ............... | 313/504 |
| 6,661,029 B1 | 12/2003 | Duggal | |
| 6,737,293 B2 | 5/2004 | Andriessen | |
| 6,777,706 B1 | 8/2004 | Tessler et al. | |
| 6,833,201 B2 | 12/2004 | Czerw et al. | |

OTHER PUBLICATIONS

Shizuo, Metal Oxides as a Hole Injecting Layer in OLED, J. Phys. D. Appl. Phys. 29 , 1196, p. 2750-2753.*
Goebbert, Wet Chemical deposition of ITO . . . Thin Solid Films 351, 1999, p. 79-84.*
Zhang, The influenece of ZnO nanorods on PDOT:PSS bugffer layer, Nanotechnology, 2005, 16, p. 2861-2864.*
Tahar et. al., Mechanism of Carrier Transport in aluminum-doped zinc oxide, 2002, Journal of Applied Physics, vol. 92, pp. 4498-4501.*

* cited by examiner

*Primary Examiner* — D. Lawrence Tarazano
*Assistant Examiner* — Gregory Clark
(74) *Attorney, Agent, or Firm* — Joseph Stecewycz

(57) ABSTRACT

An optoelectronic device is disclosed that can function as an emitter of optical radiation, such as a light-emitting diode (LED), or as a photovoltaic (PV) device that can be used to convert optical radiation into electrical current, such as a photovoltaic solar cell. The optoelectronic device comprises an anode, a hole injection/transport layer, an active layer, and a cathode, where the hole injection/transport layer includes transparent conductive nanoparticles in a hole transport material.

19 Claims, 4 Drawing Sheets

OPTOELECTRONIC DEVICE WITH NANOPARTICLE EMBEDDED HOLE INJECTION/TRANSPORT LAYER

CROSS-REFERENCE TO RELATED APPLICATION

The present Application claims the benefit of Provisional Patent Application No. 60/730,822 entitled "Nano-particle embedded hole injection/transport layers for light extraction enhancement," filed 28 Oct. 2005 and incorporated by reference herein in its entirety.

GOVERNMENT LICENSE RIGHTS

The U.S. Government has a paid-up license in this invention and the right in limited circumstances to require the patent owner to license others on reasonable terms as provided for by the terms of Contract No. DE-FG02-04-ER83894 awarded by the Department of Energy (DOE).

BACKGROUND OF THE INVENTION

1. Field of Invention

This invention relates to organic optoelectronic devices and, in particular, to a method and system for improving the efficiency of such organic optoelectronic devices.

2. Description of the Background Art

It is known in the art to incorporate nanoparticles in an optoelectronic device. U.S. Pat. No. 6,777,706 "Optical devices," issued to Tessler et al., discloses an optical device having an organic material that includes a substantially uniform dispersion of light-transmissive nanoparticles.

What is needed is a method of increasing the efficiency of organic optoelectronic devices.

SUMMARY OF THE INVENTION

The inventive device and method function to increase the efficiency of organic optoelectronic devices by including a distribution of transparent conductive nanoparticles in a hole transport and injection layer comprising a hole injection/transport polymer. The anode of the optoelectronic device may include an anode coating including transparent nanoparticles for organic optoelectronic devices such as optical light emitting diodes (OLED) and organic solar cells. The novel anode coating serves to increase internal energy efficiency and device lifetime and device extraction efficiency. The energy efficiency is enhanced by light scattering actions caused by embedded nanoparticles, by efficient hole injection, by utilizing a "3D" nano-scale TCO network, and by refractive index matching among layers structures of the organic optoelectronic devices.

DETAILED DESCRIPTION OF THE INVENTION

Figure 1:
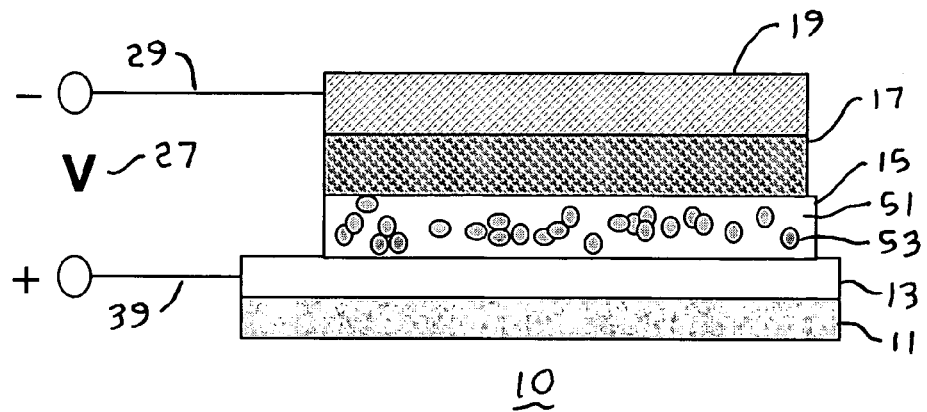
FIG. 1 is a diagrammatical representation of cross section of an optoelectronic device in accordance with the present invention.

FIG. 1 shows an optoelectronic device 10 in accordance with the present invention. The optoelectronic device 10 can function as an emitter of optical radiation, such as a light-emitting diode (LED), or as a photovoltaic (PV) device that can be used to convert optical radiation into electrical current, such as a photovoltaic solar cell. The optoelectronic device 10 comprises a glass substrate 11, an anode 13, a hole injection/transport layer 15, an active layer 17, and a cathode 19.

Figure 2:
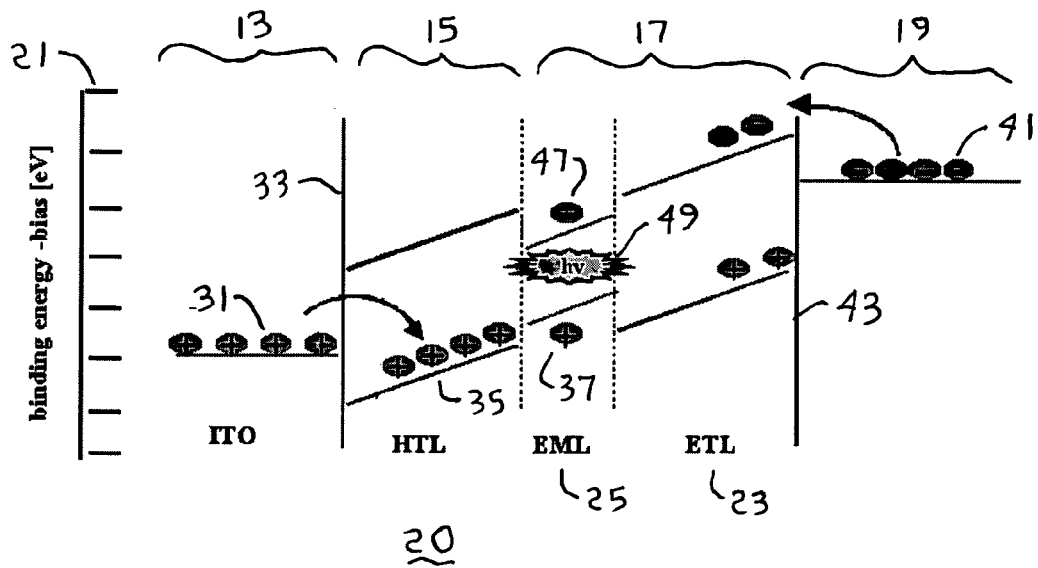
FIG. 2 is a schematic binding energy diagram for the optoelectronic device of FIG. 1.

Operation of the optoelectronic device 10 as a light-emitting diode may be described with reference to a schematic binding energy diagram 20, in FIG. 2. A vertical axis 21 is used to indicate relative binding energies, typically expressed in electron volts (eV) and the configuration of the optoelectronic device 10 is schematically represented along a horizontal direction. The active layer 17 may include an emission layer (EML) 25 and an electron transport layer (ETL) 23. Holes 31 in the anode 13 are injected across a hole injection barrier 33 into a highest-occupied molecular orbital (HOMO) 35 in the hole injection/transport layer (HTL) 15. Electrons 41 in the cathode 13 are injected across an electron injection barrier 43 into a lowest-unoccupied molecular orbital (LOMO) 45 in the electron transport layer 23.

When operating the optoelectronic device 10 as a light-emitting diode, a suitable voltage 27 (shown in FIG. 1) may be applied across the cathode 19, via a negative electrical path 29, and the anode 13, via a positive electrical path 39. A plurality of electrons 47 from the electron transport layer 23 and a corresponding plurality of holes 37 from the hole injection/transport layer 15 combine in the emission layer 25 to produce a corresponding plurality of photons 49. The anode 13 may comprise a material with a high optical transmission level so as to allow the photons 49 to pass through the anode 13 and emit from the optoelectronic device 10 through the glass substrate 11. In an exemplary embodiment, the anode 13 may comprise a transparent conductive oxide such as indium-doped tin oxide ($Sn_2O_3$).

To operate the optoelectronic device 10 as a photovoltaic cell, optical radiation may be provided to the optoelectronic device 10 as a plurality of photons 49 which then separate into the electron 47 and the hole 37, and the remaining process functions in the reverse of the light emitting diode.

In accordance with the present invention, the hole injection/transport layer 15 comprises a distribution of nanoparticles 53 in a hole-transport material 51, such as a hole injection/transport polymer matrix. The nanoparticles 53 may comprise a transparent conductive oxide, such as indium-doped $Sn_2O_3$ (ITO), antimony-doped $Sn_2O_3$ (ATO), fluorine-doped tin oxide, aluminum doped zinc oxide, and boron-doped zinc oxide. It can be appreciated by one skilled in the relevant art that ATO has a refractive index, transparency, and conductivity similar to that of ITO, as well as a lower material cost.

The nanoparticles 53 may be produced using a wet chemical method that results in a desired nanoparticle size of from about 20 nm to 100 nm, with the nanoparticle yield having a relatively narrow size distribution. The size of the nanoparticles 53 may range from 20 nm to 40 nm for applications using radiation of optical wavelengths. For applications using radiation of shorter or longer wavelengths, the size of the nanoparticles 53 can be correspondingly decreased or increased.

Figure 3:
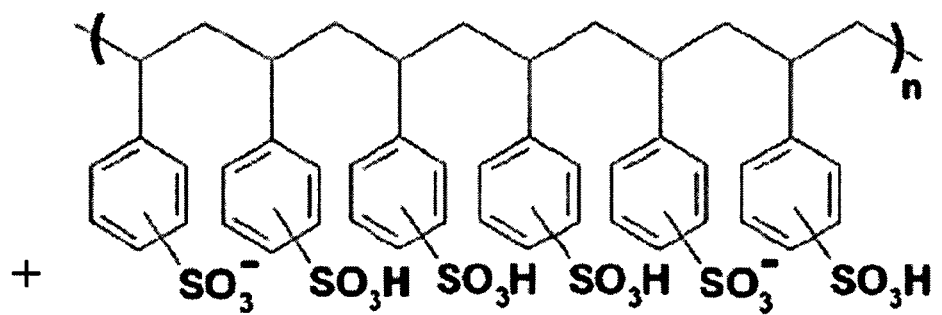
FIG. 3 is a molecular structure diagram for polystyrenesulfonic acid.
Figure 4:
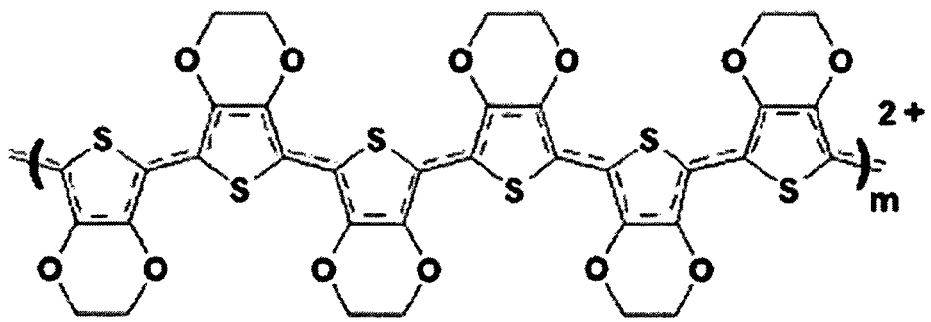
FIG. 4 is a molecular structure diagram for poly(3,4-ethylene dioxythiophene)
Figure 5:
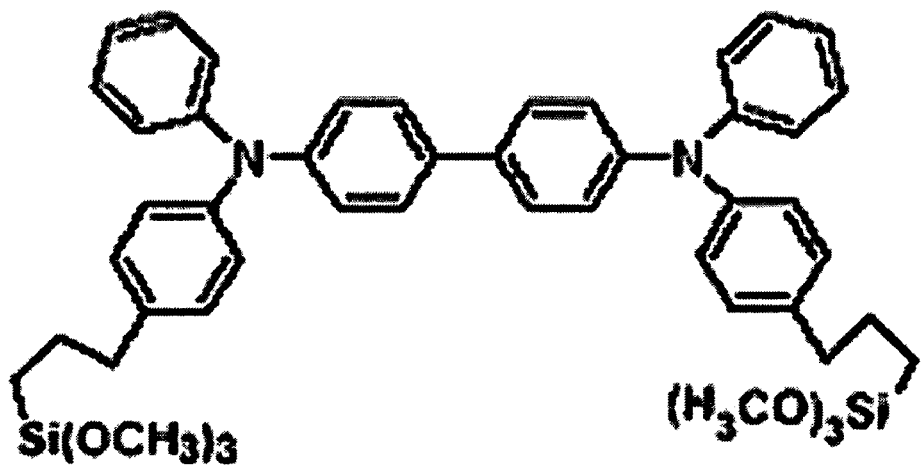
FIG. 5 is molecular structure diagram for TPD-[Si—(O—CH$_3$)$_3$]$_2$.
Figure 6:
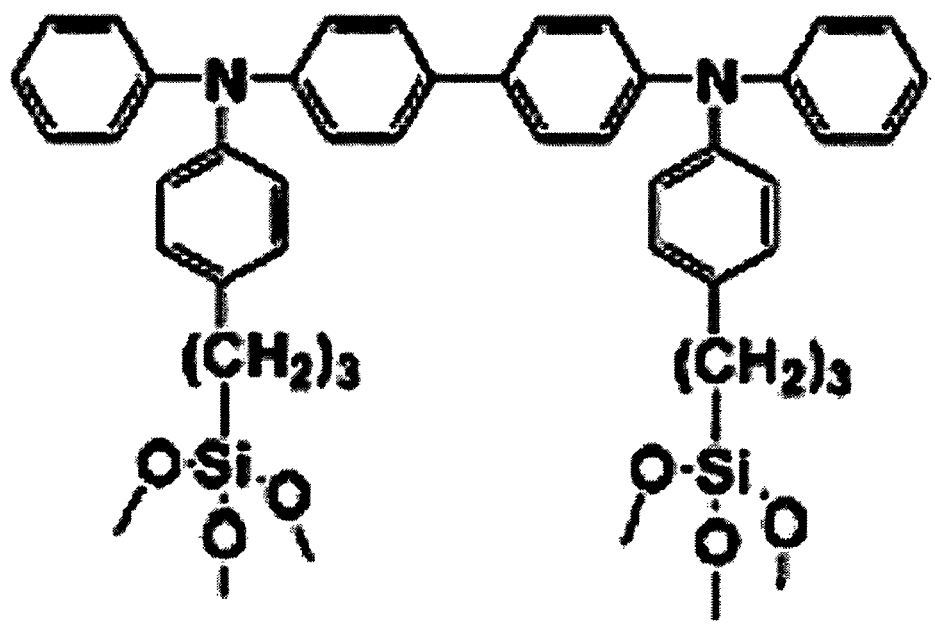
FIG. 6 is molecular structure diagram for the TPD-[Si—(O—CH$_3$)$_3$]$_2$ of FIG. 5 shown in a cross-linked configuration.

The nanoparticle distribution density in the hole injection/transport layer 15 may range from five to ninety percent by weight of nanoparticles in hole injection/transport polymer matrix. The hole-transport material 51 may comprise any one of a number of commercially-available materials, including: an aromatic amine, TPD, TPAC, CuPc, m-MTDATA, TPTE, α-NPD, PPD, and TRP. In an exemplary embodiment, the hole-transport material 51 may comprise a composite of poly (3,4-ethylene dioxythiophene) doped with polystyrenesulfonic acid (PEDOT/PSS), such as Baytron® P VP CH 8000, available from H.C. Starck, Inc., Newton, Mass. The compound mixture PEDOT/PSS comprises PSS, shown in FIG. 3, and PEDOT, shown in FIG. 4. In an alternative exemplary embodiment, the hole-transport material 51 may comprise a TPD compound, such as TPD-[Si—(O—CH$_3$)$_3$]$_2$, shown in FIG. 5. As appreciated by one skilled in the art, the TPD compound may convert to a cross-linked configuration, shown in FIG. 6, upon application as a component layer with exposure to water vapor.

The hole injection/transport layer 15 may comprise a thickness of from about 100 nm to about 1000 nm.

In an exemplary embodiment, the nanoparticles 53 may be dispersed in the hole-transport material 51 by a surface modification process without incurring severe aggregate formation. The resultant dispersal mixture may then be used to coat the anode 13 and provide the hole injection/transport layer 15. The hole injection/transport layer 15 is highly hole injection/transporting, even at a thickness of hundreds of nanometers, because of the formation of a conducting nano-particles network connected to the anode 13.

Figure 7:
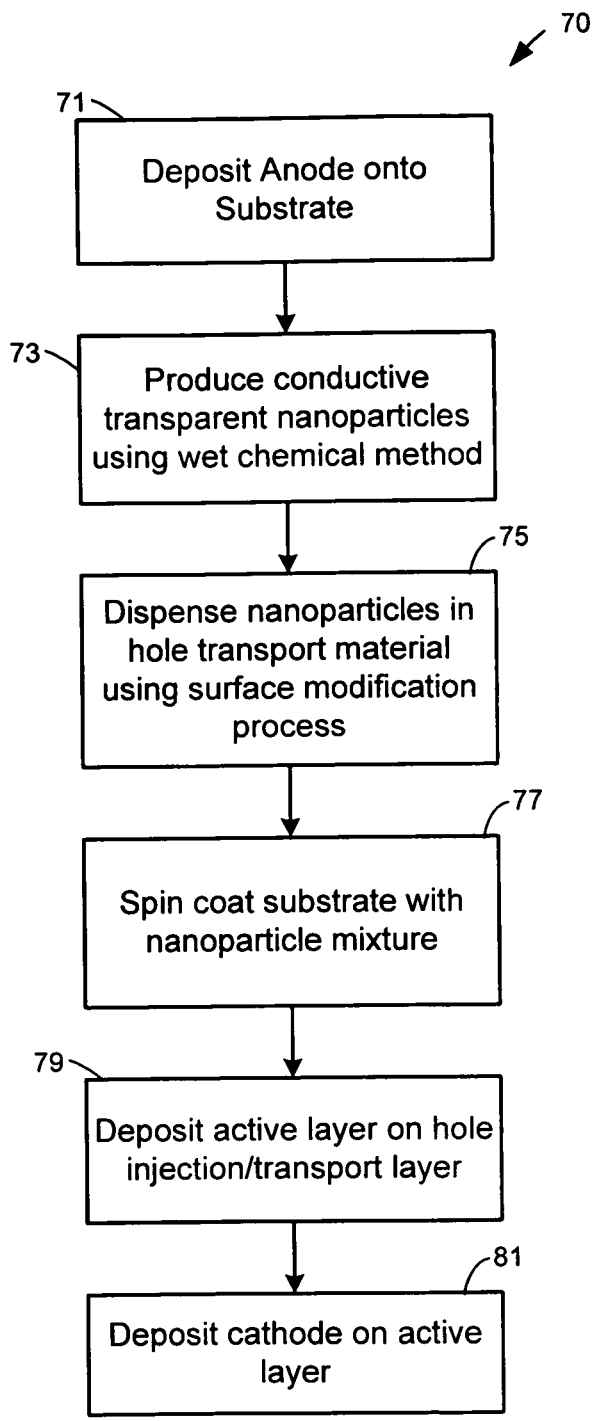
FIG. 7 is a flow diagram showing a method for fabricating the optoelectronic device of FIG. 1.

The optoelectronic device 10 may be fabricated by any method known in the relevant art. An exemplary method is shown in a flow diagram 70 in FIG. 7. The anode 13, shown in FIG. 1, can be deposited on the glass substrate 11, at step 71. Transparent conductive nanoparticles 53, as described above, may be produced using a wet chemical method, at step 73. The nanoparticles 53 may be dispensed in the hole-transport material 51 using a surface modification process, at step 75. This mixture may be applied to the anode 13 by a spinning procedure, as is well known in the art, to produce the hole injection/transport layer 15, at step 77. The active layer 17 may be deposited on the hole injection/transport layer 15, at step 79. The cathode 19 may be deposited on the hole injection/transport layer 15, at step 81.

In an exemplary embodiment, one method of producing the transparent conducting nanoparticles 53 includes a first step of dispersing a Transparent Conducting Oxide (TCO) nanopowder in water or in organic solvents, or their mixtures. TCO nanopowder includes indium tin oxide, antimony tin oxide, fluorine-doped tin oxide, aluminum doped zinc oxide, and boron-doped zinc oxide. Phosphoric acid, phosphonic acids, phosphinic acid, hydrogen phosphate, hydrogen phosphonate, hydrogen sulfate, sulfonic acid, their mixtures, and polymers bearing these functional groups thereof are selected to modify the TCO surfaces. The content of TCO in the dispersion varies from 1 to 80% by weight. The surface-modifying component varies from 0.1 to 60% by weight. The percentage of TCO in hole transport composite varies from 5 to 90% by weight. Other hole transport materials, such as 1,4-bis(phenyl-m-tolylaminobiphenyl), and 1,4-bis(1-naphthylphenylaminobiphenyl) and their derivatives, can also be used to mix with TCO.

In another exemplary embodiment, 25 grams of indium tin oxide (ITO) nanopowder, 75 grams of isopropanol, and 1 gram of bis(2-ethylhexyl)hydrogenphosphate are mixed together and sonicated for 60 minutes. A stable blue dispersion is obtained. It is diluted 10 times with isopropanol. To the PEDOT:PSS aqueous solution there is added the above ITO dispersion in the ratio of 1:1 by weight, and the resulting mixture is put into an ultrasonic bath and sonicated for 60 minutes. Stable blue ITO/PEDOT:PSS dispersion is obtained.

In yet another exemplary embodiment, 25 grams of indium tin oxide (ITO) nanopowder, 75 grams of ethanol, and 1 gram of bis(2-ethylhexyl)hydrogenphosphate are mixed together and ball-milled for 24 hours. A stable blue dispersion is obtained. The dispersion is diluted ten times with ethanol. To the PEDOT:PSS aqueous solution is added the above ITO dispersion in the ratio of 1:1 by weight, and the resulting mixture is milled for about twenty-four hours to obtain stable blue ITO/PEDOT:PSS dispersion. The TCO dispersion is applied by spin coating on TCO coated glass substrate. The thickness of the coatings is between about 100 nm. and 1000 nm.

The advantages offered by the innovative method and device include: (i) enhanced light extraction efficiency; (ii) improved refractive index matching between the glass substrate 11 and the hole injection/transport layer 15; and (iii) faster separation and transport of electron-hole pairs in the emission layer 25 by providing a three-dimensional nanoscale TCO network.

Light extraction efficiency in the optoelectronic device 10 is enhanced by the light scattering in the hole injection/transport layer 15 induced by the optically transparent and conductive nanoparticles 53. Moreover, the hole injection/transport layer 15 further has an intrinsic, high hole inject/transport characteristic with the hole transport material 51, and can significantly increase device lifetime through interfacial bonding formation.

This light extraction enhancement process may result in an increase in efficiency of about forty percent or more for the optoelectronic device 10 in comparison to that of a conventional light-emitting device without transparent conductive nanoparticles in a hole injection/transport layer. This light-scattering-induced extraction enhancement is a result of the distribution of the nanoparticles in the hole injection/transport layer 15. The induced light scattering provides additional multiple opportunities for a photon not initially in an escape cone to impinge on a nanoparticle-polymer interface, change trajectory angle one or more times, and eventually be emitted through the glass substrate 11.

The transparent conductive nanoparticles 53 may have an index of refraction of about n ~2.0, and the hole-transport material 51 may have an index of refraction of about n ~1.5. From a classical Mie theory, scattered light intensity ($I_s$) is a function of nanoparticle size, as well the refractive indices of the nanoparticles 53 and the hole-transport material 51. Scattered light intensity can thus be expressed as:

$$I_s \propto I_i \left(\frac{Nd^6}{\lambda^4}\right)\left(\frac{m^2-1}{m^2+2}\right)^2$$

where $I_i$ is the intensity of incident light, N is the number of transparent conductive nanoparticles 53, d is the nominal diameter of the transparent conductive nanoparticles 53, λ is the wavelength of incident optical radiation, and 'm' is the relative index. The parameter 'm' may be defined as (refractive index of the nanoparticles)/(refractive index of the hole-transport material). Nanomaterial engineering may serve to optimize the optical radiation scattering process through appropriate configuration of nanoparticle size, nanoparticle agglomeration, nanoparticle density, and the parameter 'm.'

Improved refractive index matching between the anode 13 and the hole injection/transport layer 15 may be accomplished by gradient distribution of the transparent conductive nanoparticles 53 in the hole transport material 51.

As can be appreciated by one skilled in the relevant art, by providing a three-dimensional nano-scale TCO network, as disclosed above, the rate of separation of electron-hole pairs and transport speeds of separated charges can be improved for organic solar cells, for example. Moreover, the rates of hole injection can be improved for light-emitting optoelectronic devices as well. These effects are made possible by increased interfaces between the TCO electrode and hole transport material.

In an alternative exemplary embodiment, a hybrid anode structure can be provided from a composite of PEDOT:PSS and indium tin oxide (ITO) nanoparticles. As a result of phase separation produced in the hybrid anode structure, a graded work function is provided from the anode 13 to the hole injection/transport layer 15. This, in turn, reduces the barrier height for the holes 31 by about 70%. An optoelectronic device based on this hybrid anode design may demonstrate an up to 67% reduction in turn-on voltage for an emitter of optical radiation, or may demonstrate an up to 40% increase in short-circuit current and power conversion efficiency for a photovoltaic device.

The above-disclosed embodiments serve to increase light extraction efficiency in an optoelectronic device by approximately 40% through the introduction of transparent conductive nanoparticles (i.e., light scattering centers) in a hole injection/transport layer. Optionally, additional extraction efficiency enhancements may be used at an air interface with the glass substrate 11. For example, a laminated lens array (not shown) may be attached to the glass substrate 11, broadband anti-reflection coatings (not shown) may be deposited on the glass substrate 11, and a low refractive index glass may be used for the glass substrate 11. With the extraction efficiency enhancements, an additional extraction efficiency improvement of about 50 to 60% can be achieved.

While the invention has been described with reference to particular embodiments, it will be understood that the present invention is by no means limited to the particular constructions and methods herein disclosed and/or shown in the drawings, but also comprises any modifications or equivalents within the scope of the claims.

What is claimed is:

1. An optoelectronic device comprising:
   an anode;
   a hole injection/transport layer disposed on said anode, said hole injection/transport layer including a gradient distribution of transparent conductive nanoparticles so as to provide refractive index matching between said anode and said hole injection/transport layer;
   an active layer disposed on said hole injection/transport layer; and
   a cathode disposed on said active layer.

2. The optoelectronic device of claim 1 wherein said hole injection/transport layer further comprises a hole-transport material.

3. The optoelectronic device of claim 2 wherein said hole-transport material comprises a member of the group consisting of: an aromatic amine, TPD, TPAC, CuPc, m-MTDATA, TPTE, α-NPD, PPD, TRP, poly(3,4-ethylene dioxythiophene), TPD-[Si—(O—CH$_3$)$_3$]$_2$, and polystyrenesulfonic acid.

4. The optoelectronic device of claim 1 wherein said hole injection/transport layer comprises about 5 to 90% by weight of said transparent conductive nanoparticles.

5. The optoelectronic device of claim 1 wherein said transparent conductive nanoparticles comprise at least one member of the group consisting of: indium-doped $Sn_2O_3$, antimony-doped $Sn_2O_3$, fluorine-doped tin oxide, aluminum doped zinc oxide, and boron-doped zinc oxide.

6. The optoelectronic device of claim 1 wherein said transparent conductive nanoparticles have a longest dimension of from about twenty nanometers to about one hundred nanometers.

7. The optoelectronic device of claim 1 wherein said hole injection/transport layer comprises a thickness of from about one hundred nanometers to about one thousand nanometers.

8. The optoelectronic device of claim 1 wherein said anode comprises a transparent conductive oxide.

9. The optoelectronic device of claim 1 wherein said anode comprises a composite of indium tin oxide nanoparticles and poly(3,4-ethylene dioxythiophene) doped with polystyrenesulfonic acid.

10. An optoelectronic device suitable for fabrication on a substrate, said optoelectronic device comprising:
    a transparent conductive oxide layer deposited on the substrate;
    a hole injection/transport layer disposed on said transparent conductive oxide layer, said hole injection/transport layer including a gradient distribution of transparent conductive nanoparticles disposed in a hole-transport material so as to provide refractive index matching between said transparent conductive oxide layer and said hole injection/transport layer;
    an active layer disposed on said hole injection/transport layer; and
    a cathode disposed on said active layer.

11. The optoelectronic device of claim 10 wherein said gradient distribution of transparent conductive nanoparticles further comprises a three-dimensional nano-scale transparent conductive oxide network disposed within said hole-transport material.

12. A method for fabricating an optoelectronic device, said method comprising the steps of: producing a mixture of transparent conductive nanoparticles and a hole-transport material;
    applying a layer of said mixture onto an anode to form a hole injection/transport layer whereby the transparent conductive nanoparticles in the hole injection/transport layer form a gradient distribution;
    depositing an active layer onto said hole injection/transport layer; and
    depositing a cathode on said active layer.

13. The method of claim 12 wherein said step of producing comprises the step of modifying surfaces of said transparent conductive nanoparticles by treatment with at least one member of the group consisting of: phosphoric acid, phosphonic acid, phosphinic acid, hydrogen phosphate, hydrogen phosphonate, hydrogen sulfate, and sulfonic acid.

14. The method of claim 12 wherein said step of producing comprises the step of mixing indium tin oxide nanopowder, bis(2-ethylhexyl)hydrogen phosphate, and at least one of isopropanol or ethanol to obtain a dispersion.

15. The method of claim 14 wherein said step of producing further comprises the step of sonicating said dispersion in an ultrasonic bath.

16. The method of claim 12 wherein said step of producing further comprises the steps of:

adding said dispersion to a composite of poly(3,4-ethylene dioxythiophene) doped with polystyrenesulfonic acid; and milling said dispersion mixture for a predetermined length of time.

17. The method of claim 12 wherein said hole-transport material comprises at least one of 1,4-bis(phenyl-m-tolylaminobiphenyl), and 1,4-bis(1-naphthylphenylaminobiphenyl).

18. The method of claim 12 further comprising the step of specifying the ratio of the refractive index of said transparent conductive nanoparticles to the refractive index of said hole-transport material so as to improve radiation scattering by said transparent conductive nanoparticles.

19. The method of claim 12 further comprising the step of exposing said hole injection/transport layer to water vapor to form a cross linked configuration, wherein said mixture includes TPD-[Si—(O—CH$_3$)$_3$]$_2$.

\* \* \* \* \*